United States Patent [19]

Oprysko et al.

[11] Patent Number: 4,543,270
[45] Date of Patent: Sep. 24, 1985

[54] METHOD FOR DEPOSITING A MICRON-SIZE METALLIC FILM ON A TRANSPARENT SUBSTRATE UTILIZING A VISIBLE LASER

[75] Inventors: Modest M. Oprysko, Roselle; Mark W. Beranek, Arlington Heights, both of Ill.

[73] Assignee: Gould Inc., Rolling Meadows, Ill.

[21] Appl. No.: 622,366

[22] Filed: Jun. 20, 1984

[51] Int. Cl.[4] ............................................. C23C 11/02
[52] U.S. Cl. .................................. 427/53.1; 427/54.1
[58] Field of Search ............................ 427/53.1, 54.1

[56]  References Cited
U.S. PATENT DOCUMENTS

| | | | |
|---|---|---|---|
| 2,883,257 | 4/1959 | Wehe | |
| 3,271,180 | 9/1966 | White | 204/159.22 |
| 3,364,087 | 1/1968 | Solomon et al. | 156/635 |
| 4,042,006 | 8/1977 | Engl et al. | 427/43.1 |
| 4,340,617 | 7/1982 | Deutsch et al. | 427/53.1 |
| 4,451,503 | 5/1984 | Blum et al. | 427/53.1 |

Primary Examiner—John H. Newsome
Attorney, Agent, or Firm—G. P. Edgell; Edward E. Sachs; Jeannette M. Walder

[57] ABSTRACT

A method for depositing a micron-size metallic film on a transparent substrate by thermal deposition employing a focused visible laser. The method includes the step of positioning the substrate in a gas cell containing a metal bearing gaseous compound. A nucleation layer is formed on a surface of the substrate by either shining an ultraviolet light on the substrate surface or by heating the substrate to a temperature which is less than the temperature at which the molecules of the gaseous compound decompose. Next, a laser which may be visible or near infrared is focused onto the substrate to provide localized heating of the area of the substrate to which the beam is incident. Molecules of the gaseous compound thermally decompose on the heated area to deposit a metal film thereon.

8 Claims, 2 Drawing Figures

METHOD FOR DEPOSITING A MICRON-SIZE METALLIC FILM ON A TRANSPARENT SUBSTRATE UTILIZING A VISIBLE LASER

TECHNICAL FIELD

The present invention relates to a method for the maskless deposition of a micron-size metallic film on a transparent substrate by thermal deposition utilizing a focused visible laser or rear infrared laser and to such a method for repairing clear defects in photomasks.

BACKGROUND OF THE INVENTION

Various methods are known for locally depositing a metal film on a transparent substrate, these methods having been used to repair clear defects in photomasks which are used in the manufacture of semiconductor devices. One known method includes the step of depositing a photoresist over the entire surface of the photomask containing the defect. The defective area is then exposed to ultraviolet radiation, after which the photoresist is developed to dissolve the material where it has been exposed to the radiation. The substrate is then placed in a vacuum chamber in which chromium is evaporated to deposit chromium on the surface of the substrate. The photoresist is removed leaving a chromium deposit on the area exposed to the ultraviolet radiation. This method for repairing a photomask is not only time-consuming and of limited resolution, but further results in chromium deposits in undesired areas thus creating additional defects in the photomask which must be removed.

One known method for depositing a metal film on a substrate as shown in the U.S. Pat. No. 4,340,617 employs an ultraviolet laser which is focused onto a substrate positioned in a gas cell into which metal bearing gases are introduced. The gas absorbs a portion of the laser energy for effecting photodecomposition of the gas near the surface of the substrate to deposit metal material on the substrate. This method is undesirable because ultraviolet laser sources are typically very large in size, bulky and have been found to be unstable when operating continuously for a given period of time. The optics used with such lasers are also very difficult to adjust resulting in problems with focusing and resolution. Further, photodeposition rates are typically low.

Another known method for depositing a metal film on a substrate is a laser-induced thermal deposition process. One such process employs a $CO_2$ laser, generating infrared radiation, to deposit a metal film on a quartz substrate. This method has been found undesirable, however, because the resolution is limited essentially to the wavelength of the radiation; namely, 10 $\mu$m and the complications involving far infrared optics. Another known thermal deposition process employs a visible laser to deposit a metal film on an opaque substrate. Problems have arisen with this process, however, when the visible laser is employed to deposit a metal film on a transparent substrate. It has been found that it takes a very long time to heat a clean transparent substrate to the point at which the metal bearing molecules decompose on the hot substrate surface and stick thereto to form a metal film on the substrate surface. Typically, the visible laser heats the transparent substrate a little, causing the molecules to decompose, however, the metal film does not immediately stick to the substrate but evaporates. After heating the substrate a sufficiently long period of time, on the order of 2-3 seconds, a metal deposit will form on the substrate surface, the deposit being much larger than the area of the substrate to which the visible laser is incident. There is very little control over the size of the metal deposit produced by this method so that the deposits are not reproducible. Further, very small deposits on the order of a micron cannot be made with this method.

DISCLOSURE OF THE INVENTION

In accordance with the present invention, the disadvantages of prior methods for depositing metal films on transparent substrates have been overcome. The method of the present invention provides maskless deposition of a micron-size metallic film on a transparent substrate by thermal deposition employing a focused visible laser, or laser whose wavelength is 2 $\mu$m or less, the method being suitable or repairing clear defects in photomasks. With reference to this application, when the term "infrared laser" is used, it means a laser having a wavelength of 2 $\mu$m or less.

In carrying out the method of the present invention, a transparent substrate or photomask is positioned in a gas cell containing a metal bearing gaseous compound. A nucleation layer is formed on the substrate surface by shining ultraviolet light thereon or by heating the substrate to a temperature which is less than the temperature at which the molecules of the gaseous compound decompose. The nucleation layer thus formed provides sites for future film growth—in effect "seeding" the surface. When a visible laser or laser whose wavelength is less than 2 $\mu$m is focused onto the substrate, localized heating of the area of the substrate to which the beam is incident results. Molecules of the gaseous compound in the gas cell which randomly strike the heated area decompose. In general, the metal atoms do not stick to the transparent substrate but evaporate. However, an enhancement in sticking probability is observed in the nucleated areas. A metal film is thus formed only in that area of the substrate which was nucleated and to which the laser beam was incident. Furthermore, the nucleation layer allows the location and size of the deposit to be controlled and reproducible so that very small deposits on the order of a micron may be made. The nucleation layer also increases the rate such that it is much greater than the rates of prior thermal deposition and photodeposition techniques.

The method of the present invention provides a very durable deposit on the transparent substrate, the deposit being capable of withstanding the standard processes for cleaning photomasks. Further, deposition according to this method does not damage the substrate or photomask so that a metal film deposited on the substrate according to this method may be removed with a laser. This method is also advantageous in that it employs a visible laser which is very stable, easily focused, has a high resolution, and has the potential to be very small and compact as compared to a system based on an ultraviolet laser.

These and other objects and advantages of the invention, as well as the details of an illustrative embodiment, will be more fully understood form the following description and the drawings.

BEST MODE FOR CARRYING OUT THE INVENTION

Figure 1:
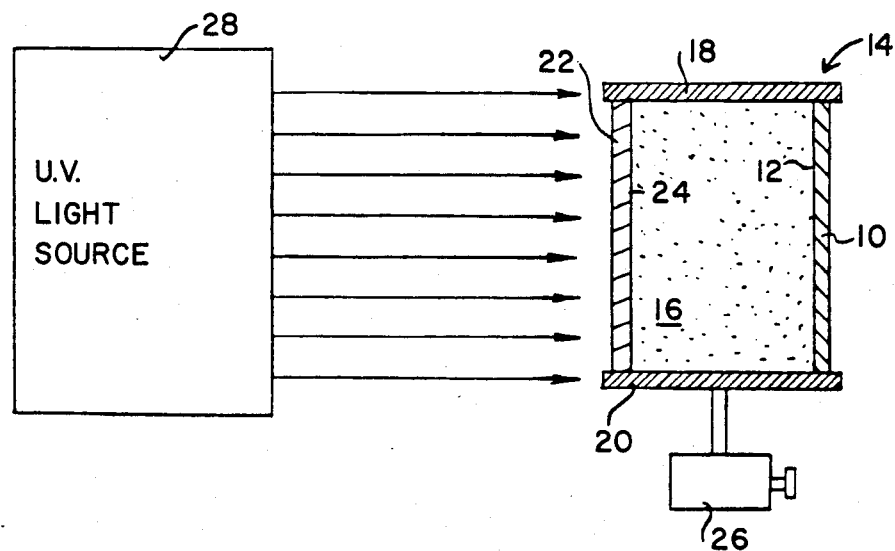
FIG. 1 is a block diagram illustrating the step of forming the prenucleation layer on a transparent substrate according to the method of the present invention.

In order to deposit a metal film on a transparent substrate 10 according to the method of the present invention, a surface 12 of the substrate, as shown in FIG. 1, is positioned in a gas cell 14 which contains a metal-bearing gaseous compound 16. The gas cell 14 includes metal end plates 18 and 20. The cell 14 also includes a window 22 which is transparent to light from a source used to form a prenucleation layer on the substrate 10 and to light from a source used for thermal deposition as discussed in detail below. The window 22 may, for example, be made of quartz. The substrate 10 also forms a window of the gas cell 14 with the surface 12, on which a metal deposit is to be made, forming an inner surface of the cell. Other gas cell configurations may be employed to carry out the method of the present invention. For example, the substrate 10 may be suspended within a gas cell or the substrate 10 may replace the window 22 so that a metal deposit can form on an inner surface 24 thereof.

The metal-bearing gaseous compound 16 is supplied to the cell 14 by an apparatus 26 which includes a valve or the like to adjust the pressure of the gas. The metal-bearing gas may be a metal alkyl, halide or carbonyl and is preferably an organo-metallic compound which exhibits a sufficiently high vapor pressure and a sufficiently low decomposition temperature, i.e., below 200° C., so as to be suitable for thermal decomposition and deposition on the substrate 10. One preferred compound is $W(CO)_6$. Another preferred compound is $Al(CH_3)_3$.

After positioning the transparent substrate in the gas cell 14, a nucleation layer is formed on the substrate to seed the surface 12 thereof. The nucleation layer is a random deposit of parts of the gaseous compound 16 on the surface 12 of the substrate, forming one or a few monolayers on the substrate surface which are substantially invisible and removable. One method for forming the nucleation layer employs an ultraviolet light source 28 such as a $H_g$ lamp or ultraviolet laser. The ultraviolet light from the source 28 passes through the window 22 and illuminates the entire surface 12 of the substrate 10 to randomly deposit parts of the metal-bearing compound 16 on the substrate surface to form a nucleation layer thereon. Another method for forming the nucleation layer includes the step of heating the gas cell 14 to heat the substrate 10 to a temperature which is less than the temperature at which the molecules of the gaseous compound 16 decompose to randomly deposit parts of the compound 16 on the substrate surface 12.

Figure 2:
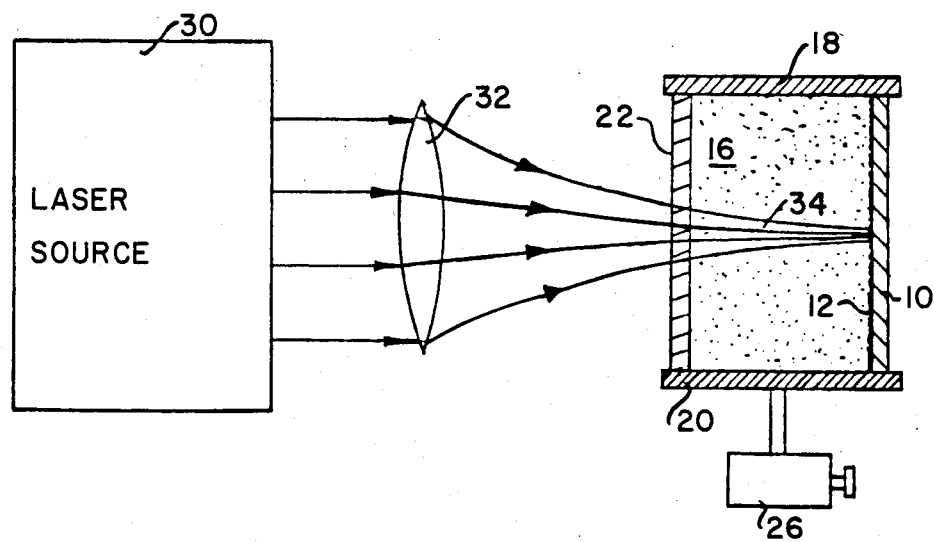
FIG. 2 is a block diagram illustrating the step of depositing a metal film on the substrate utilizing a visible laser according to the method of the present invention.

After the nucleation layer is formed, a laser source 30, as shown in FIG. 2, is employed to induce thermal deposition of metal-bearing molecules from the compound 16 on the surface 12 of the substrate 10. It is noted that the laser employed for the thermal deposition process may be either a visible laser or a near infrared laser having a wavelength of 2 microns or less. The visible laser beam or near infrared laser beam from the source 30 is focused by a microscope objective 32 onto the surface of the substrate 10 to provide localized heating of the area of the substrate to which the beam is incident. Molecules of the gaseous compound 16 thermally decompose on the heated area to deposit a metal film thereon, the metal film covering only that area of the substrate to which the laser beam is incident.

The nucleation layer formed on the substrate surface 12 serves as a seed for metal-film growth and thus allows the size of the metal deposit to be controlled and reproducible so that very small deposits, on the order of a micron, may be made. The small size of the metal deposit made according to this method is limited only by the optics 32 available to focus the laser beam. Further, the nucleation layer results in a greater deposition rate than has heretofore been possible employing prior thermal deposition and photodeposition techniques. For example, the deposit time for the present method may be much less than one second whereas the deposition time for prior methods is typically on the order of two to three seconds. The deposition rate may further be enhanced by regulating the vapor pressure of the gaseous compound 16. Where the metal-bearing gaseous compound 16 is $W(CO)_6$ or $Al(CH_3)_3$, to increase the vapor pressure and thus enhance the deposition rate, the compound may be heated to a temperature between 90° C. and 150° C.

The method of the present invention for depositing a metal film on a transparent substrate may be used to repair clear defects in a photomask which is formed of a transparent material such as quartz or glass with a metal pattern, usually chrome, formed thereon. The photomask is first positioned in a gas cell, such as the cell 14, with the masked surface forming an inner surface of the cell. A nucleation layer is formed on the chrome-coated surface of the photomask as described above, after which a visible laser or a near infrared laser is focused onto the defective area to heat the area of the photomask which is incident to the laser beam. Molecules of the gaseous compound 16 thermally decompose on the heated area to deposit a metal film on the clear defect of the photomask.

The method of the present invention allows the size of the deposit to be controlled and reproducible so that very small deposits, on the order of a micron, may be made on a defective area of a photomask. The deposition method provides a repair which is very durable and capable of withstanding the standard processes for cleaning a photomask. Further, the method for depositing a metal film does not damage the substrate 10 or photomask so that a deposit may be removed if desired.

It should be noted that the subject invention comprehends an alternate method to repair clear defects in photomasks. This method may be preferred in some embodiments. In the alternative method, a laser of wavelength 2 $\mu$m or less is focused on the edge of a metal pattern or line adjacent to the clear defect to be corrected (i.e., the quartz area onto which metal is to be deposited). A deposit is formed on the chrome in the area to which the focused laser was incident. The periphery of this metal deposit serves as the nucleation site for further deposition on the clear defect area (i.e., the quartz area). The laser is moved to this area and a reproducible micron-size deposit is formed. This process is continued until the entire clear defect is covered with metal. The method allows for the controlled growth of micron-size method deposits.

In another embodiment, the entire transparent substrate can be heated to just below the thermal decomposition temperature of the gas molecules to aid the laser deposition process. A focused laser beam incident on this heated substrate will quickly raise the temperature locally so that gas molecules which randomly strike the area are decomposed leaving behind a metal film deposit.

This application is related to cocurrently filed U.S. patent application Ser. No. 622,367 entitled "Method for Repairing a Photomask by Laser-Induced Polymer Degradation" and U.S. patent application Ser. No. 622,368 entitled "Laser-Based System for the Total Repair of Photomasks." Both of these applications are incorporated herein by reference.

Although the invention has been described and illustrated in detail, it is to be clearly understood that the same is by way of illustration and example only, and is not to be taken by way of limitation; the spirit and scope of this invention being limited only by the terms of the appended claims.

We claim:

1. The method of reproducibily depositing a micron sized film of metal on a transparent surface in a closely controlled location and area comprising the steps of:
   covering said surface with a metal bearing gaseous compound,
   forming a nucleation layer of scattered parts of metal on said surface over the general area on which said film is to be deposited,
   and focusing a visible laser beam on the point of said surface to have the film so as to heat that point beyond the temperature required to thermally decompose said compound and deposit a film on that point.

2. The method of claim 1 in which said surface is a photomask and said film is to repair a clear defect in said photomask.

3. The method of claim 1 in which said surface is covered by placing the surface in a cell containing said metal bearing gaseous compound.

4. The method of claim 1 in which said layer is formed by irradiating said general area with ultraviolet radiation so that said metal compound forms said layer.

5. The method of claim 1 in which said layer is formed by focusing a laser beam on the edge of an existing film on said surface adjacent said general area and thus causing said nucleation layer to be formed from said gaseous compound on said general area.

6. The method of claim 1 in which said layer is formed by heating said surface and adjacent gaseous compound to the point where said metal compound forms said layer.

7. The method of claim 1 in which said laser beam has a wave length in the 400 to 2000 nanometer range.

8. The method of claim 1 including the step of heating said surface to a temperature below that required to thermally decompose said compound before focusing said laser beam to deposit said film.

* * * * *